US010931321B1

United States Patent
Ericson et al.

(10) Patent No.: US 10,931,321 B1
(45) Date of Patent: Feb. 23, 2021

(54) SYSTEM AND METHOD FOR OPTIMIZING INTERMODULATION PERFORMANCE OF RECEIVERS

(71) Applicant: Eagle Technology, LLC, Melbourne, FL (US)

(72) Inventors: Daniel W. Ericson, Hollis, NH (US); Mac L. Hartless, Forest, VA (US); Dennis R. Layne, Forest, VA (US); Nathan T. Prosser, Rochester, NY (US); Catherine D. Royster, Lynchburg, VA (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 16/737,582

(22) Filed: Jan. 8, 2020

(51) Int. Cl.
| | |
|---|---|
| *H04B 1/10* | (2006.01) |
| *H04B 17/20* | (2015.01) |
| *H04B 1/12* | (2006.01) |
| *H04L 27/26* | (2006.01) |
| *H03G 3/30* | (2006.01) |

(52) U.S. Cl.
CPC ........... *H04B 1/123* (2013.01); *H03G 3/3052* (2013.01); *H04L 27/2649* (2013.01); *H03G 2201/103* (2013.01); *H03G 2201/106* (2013.01)

(58) Field of Classification Search
CPC ... H04B 1/06; H04B 1/10; H04B 1/16; H04B 1/1026; H04B 17/00; H04B 17/20; H04B 17/29
See application file for complete search history.

(56) References Cited

U.S. PATENT DOCUMENTS

| | | | | |
|---|---|---|---|---|
| 5,287,556 A | * | 2/1994 | Cahill | H04B 1/1027 455/266 |
| 5,369,792 A | | 11/1994 | Matsumoto et al. | |
| 5,715,282 A | | 2/1998 | Mansouri et al. | |
| 5,732,341 A | * | 3/1998 | Wheatley, III | H04B 1/7097 455/234.1 |
| 6,009,129 A | * | 12/1999 | Kenney | H04B 1/7102 375/346 |
| 6,070,062 A | * | 5/2000 | Yoshida | H03G 3/3052 455/234.1 |
| 6,084,919 A | | 7/2000 | Kleider et al. | |
| 6,614,806 B1 | * | 9/2003 | Nanni | H04B 1/1027 370/252 |
| 7,103,336 B1 | * | 9/2006 | Miyajima | H03G 3/3052 375/345 |

(Continued)

*Primary Examiner* — Blane J Jackson
(74) *Attorney, Agent, or Firm* — Fox Rothschild LLP; Robert J. Sacco; Carol E. Thorstad-Forsyth

(57) ABSTRACT

Systems and methods for mitigating broadband and/or Intermodulation ("IM") interference. The methods comprise: monitoring performance of at least one demodulator performance metric of a communication device; detecting when the communication device is under or will be under an influence of IM interference based on a performance of the at least one demodulator performance metric; determining an improved level of gain to be applied to (i) a variable attenuator of the communication device or (ii) a variable gain low noise amplifier of the communication device; and selectively adjusting an amount of gain being applied by the variable attenuator or variable gain low noise amplifier based on the improved performance achieved with new level of attenuation.

17 Claims, 12 Drawing Sheets

(56) References Cited

U.S. PATENT DOCUMENTS

| | | |
|---|---|---|
| 7,630,686 B2 * | 12/2009 | Fukutani .............. H04B 1/1027 |
| | | 375/344 |
| 8,655,304 B2 | 2/2014 | Makhlouf et al. |
| 9,008,020 B2 | 4/2015 | Yacobi et al. |
| 9,743,288 B2 | 8/2017 | Grosspietsch et al. |
| 10,263,719 B2 | 4/2019 | Gallagher et al. |
| 10,264,462 B2 | 4/2019 | Song et al. |
| 2008/0039041 A1 * | 2/2008 | Buchwald ............ H03G 3/3068 |
| | | 455/234.1 |
| 2017/0230210 A1 * | 8/2017 | Narasimha ............. H04B 1/525 |

* cited by examiner

SYSTEM AND METHOD FOR OPTIMIZING INTERMODULATION PERFORMANCE OF RECEIVERS

BACKGROUND

Statement of the Technical Field

The present document concerns communication systems. More particularly, the present document concerns systems and methods for optimizing intermodulation performance of receivers.

Description of the Related Art

Conventional radios include Land Mobile Radios ("LMRs"). When LMRs get close to base station sites that may be broadband or narrow band operating in the same or neighboring frequency allocations, they experience relatively high levels of the nearby base station signal interference. This interference can produce significant intermodulation ("IM") products which may degrade radio performance or sensitivity by raising the noise floor of the receiver. Receiver sensitivity is most commonly lost as a cube of the interference power (e.g., 3 times the rate in dB). More generally, rates from 2-5 $dB_{Desense}/dB_{Interference}$ are common. These effects are further aggravated by the high peak to average power ratio characteristics of broadband signals.

SUMMARY

This document concerns systems and methods for mitigating IM interference. The methods comprise: monitoring performance of at least one demodulator of a communication device; detecting when the communication device is under or will be under an influence of IM interference based on a performance of the demodulator; determining an improved level of gain to be applied by a variable attenuator of the communication device or by a variable gain low noise amplifier of the communication device; and selectively adjusting an amount of gain being applied by the variable attenuator or variable gain low noise amplifier based on the improved level of radio performance. The performance of the demodulator may be defined by a Bit Error Rate ("BER"), a Block Drop Rate ("BDR"), an Average Symbol Error ("ASE"), a synchronization error, a modulation fidelity, and/or other measures of received signal quality well known by those versed in the art.

In some scenarios, the detecting comprises: obtaining at least one first demodulation performance metric for the demodulator that is associated with a first gain setting of a first receiver; configuring the first receiver in accordance with a second gain setting; obtaining at least one second demodulation performance metric for the demodulator that is associated with the second gain setting; and comparing the first demodulation performance metric with the second demodulation performance metric. The operating gain of the receiver is adjusted as required to match the gain setting with the better demodulation performance metric. The measurement process is then repeated ensuring that the receiver gain converges to its optimum value.

In those or other scenarios, the methods further comprise: operating a first receiver in accordance with a first gain setting; and operating a second receiver in accordance with a second gain setting different from the first gain setting. The detecting comprises: obtaining at least one first demodulation performance metric associated with the first gain setting of the first receiver, and at least one second demodulation performance metric associated with the second gain setting of the second receiver; and comparing the first demodulation performance metric of the first receiver to the second demodulation performance metric of the second receiver. The operating gain of the receivers are adjusted as required to match the gain setting with the better demodulation performance metric. The measurement process is then repeated ensuring that the receiver gains converge to an optimum value. The output of a demodulator of the first receiver may be combined with an output of a demodulator of the second receiver to obtain improved performance.

In those or other scenarios, the methods further comprise: operating a primary receiver in accordance with a given gain setting; and operating a secondary receiver with a lower linearity as compared to a linearity of the primary receiver. The detecting comprises: obtaining at least one demodulation performance metric for the secondary receiver; optionally obtaining at least one demodulation performance metric for the primary receiver, and analyzing the demodulation performance metrics to determine whether the communication device is under or will be under an influence of IM interference. A determination of the improved level of gain for the primary receiver is triggered when an analysis the demodulation performance metric indicates that the communication device is under or will be under an influence of IM interference and a gain adjustment is predicted to improve performance.

BRIEF DESCRIPTION OF THE DRAWINGS

This disclosure is facilitated by reference to the following drawing figures, in which like numerals represent like items throughout the figures.

DETAILED DESCRIPTION

Figure 1:
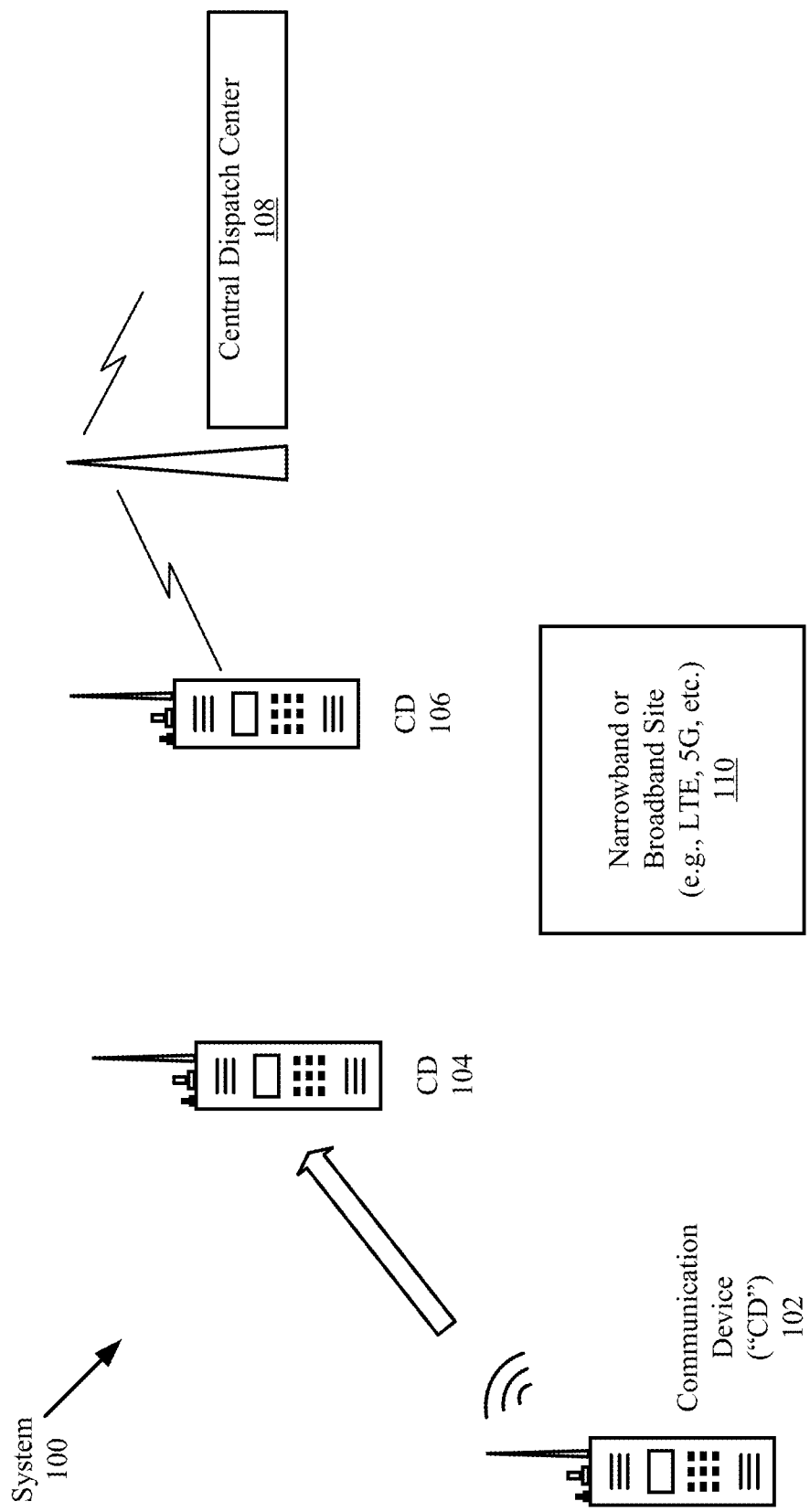
FIG. 1 is an illustration of an illustrative system implementing the present solution.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in various different scenarios. While the various aspects are presented in the drawings, the drawings are not necessarily drawn to scale unless specifically indicated.

Reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

The terms "memory," "memory device," "data store," "data storage facility" and the like each refer to a non-transitory device on which computer-readable data, programming instructions (e.g., instructions 250 of FIG. 2, 350 of FIG. 3, 450 of FIG. 4, and/or 550 of FIG. 5) or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

This document generally concerns systems and methods for operating a communication device so as to mitigate intermodulation interference (e.g., broadband and/or narrowband) to a receiver. The methods comprise: monitoring performance of at least one demodulator of a communication device; detecting when the communication device is under or will be under an influence of IM interference based on a performance metric of the demodulator; determining an improved level of gain to be applied to a variable attenuator of the communication device or a variable gain low noise amplifier of the communication device; and selectively adjusting an amount of gain being applied by the variable attenuator or variable gain low noise amplifier based on the improved demodulation metrics. The performance of the demodulator may be defined by a BER, a BDR, an ASE, a synchronization error, a modulation fidelity, and/or other measures of received signal quality well known by those versed in the art.

In some scenarios, the detecting comprises: obtaining at least one first demodulation performance metric for the demodulator that is associated with a first gain setting of a first receiver; configuring the first receiver in accordance with a second gain setting; obtaining at least one second demodulation performance metric for the demodulator that is associate with the second gain setting; and comparing the first demodulation performance metric with the second demodulation performance metric. The improved level of gain is determined by setting the receiver to the value of gain that provided a higher performance value.

In those or other scenarios, the methods further comprise: operating a first receiver in accordance with a first gain setting; and operating a second receiver in accordance with a second gain setting different from the first gain setting. The detecting comprises: obtaining at least one first demodulation performance metric associated with the first gain setting of the first receiver, and at least one second demodulation performance metric associated with the second gain setting of the second receiver; and comparing the first demodulation performance metric of the first receiver to the second demodulation performance metric of the second receiver. The improved level of gain is determined by setting the receiver to the value of the gain that provided a higher performance value. The output of a demodulator of the first receiver may be combined with an output of a demodulator of the second receiver to provide improved performance. Techniques for combining multiple receiver outputs are well known and may include: selecting the better performing receiver, adding receiver outputs, maximum ratio combining, and other techniques.

In those or other scenarios, the methods further comprise: operating a primary receiver in accordance with a given gain setting; and operating a secondary receiver with a lower linearity as compared to a linearity of the primary receiver. The detecting comprises: obtaining at least one demodulation performance metric for the secondary receiver; and analyzing the at least one demodulation performance metric to determine whether the communication device is under or will be under an influence of IM interference. A determination of the improved level of gain for the primary receiver is triggered when an analysis of the demodulation performance metric indicates that the communication device is under or will be under an influence of IM interference.

Notably, the present solution is distinguishable from conventional solutions for mitigating broadband interference. In this regard, it should be understood that, unlike conventional solutions, the present solution does not address broadband interference by: varying a signal's bandwidth for best BER performance; using training sequences for evaluating a plurality of filters and selecting one of the plurality of filters based on the evaluation results; and/or clipping a baseband signal in a receiver when a digitized bandwidth is greater than a channel selection. These are important distinctions between the present solution and that of conventional solutions. For example, the present solution is less computationally and resource intensive as compared to that of the conventional solutions.

The present solution allows an Automatic Gain Controller ("AGC") to deploy different gain profiles either sequentially with one receiver or simultaneously with more than one receiver to evaluate demodulated performance using some combination of selected post demodulation performance metrics. This allows the communication device to perform with better sensitivity as it converges to the best gain profile for the signal and interference it is encountering. A front-end attenuator and/or a variable gain Radio Frequency ("RF") amplifier are used to adjust receiver gain. The basis for AGC action is the quality of the recovered (demodulated) signal. The present solution seeks to optimize receiver gain control based on post-demodulation performance changes with receiver gain profile adjustments. This approach allows the communication device's gain profile to be adjusted for best performance even under severe interference. The present solution estimates IM interference based on post detector performance of the receiver. For example, the BER may be monitored and analyzed with two different gain settings. If decreasing gain improves the demodulator's performance, then the AGC knows that IM interference is present and takes appropriate action (e.g., adjusts the amount of gain to be applied by a variable attenuator or amplifier).

Notably, the present solution uses demodulation metrics as an indirect measurement of IM interference. This feature of the present solution is distinguishable from how IM interference is detected by conventional solution. In conventional solutions, the IM interference is directly observed from the received signal. In effect, the present solution provides improved LMR receivers since conventional LMR receivers are only able to observe a desired channel and not the energy that produces the interference.

Referring now to FIG. 1, there is provided an illustration of an illustrative system 100. System 100 comprises a plurality of communication devices 102, 104, 106, a Central Dispatch Center ("CDC") 108, and a narrowband or broadband site 110. The communication devices 102-106 include, but are not limited to, a portable radio (e.g., an LMR), a fixed radio with a static location, a smart phone, and/or a base station. In the LMR scenarios, the communication devices 102-106 can be configured to communicate in the VHF band, UHF band, 700 MHz band, the 800 MHz band, and/or the 900 MHz band. As a broadband site 110 includes, but is not limited to, an LTE site, a 2G cellular site, a 3G cellular site, a 4G cellular site, and/or a 5G cellular site. As a narrowband site 110 includes, but is not limited to, LMR sites, commercial communications, Federal communications, and paging signals. CDC 108 and site 110 are well known in the art, and therefore will not be described herein.

During operation of system 100, signals are communicated between the communication devices 102-106 and/or between one or more communication devices and the CDC 108. For example, communication device 102 communicates a signal to communication device 104, and CDC 108 communicates a signal to communication device 106.

Communication devices 104 and 106 perform operations to mitigate interference caused by the site 110. The interference results because the nearby site 110 signal is captured by communication devices 104 and 106 at a very high power level. This power level is high enough to cause a non-linear response in the receiver. This response creates an elevated noise floor within the receiver that spreads the interfering site 110 signal across a much wider bandwidth than its transmission. This spreading manifests as an elevated noise floor superimposed on the desired signal of communication devices 104 and 106. The interference is caused in at least the downlink communications that is the direction of communications associated with reception of signals by the communication devices. For example, an LMR 700 MHz down link signal may experience interference from an adjacent 758-768 MHz FirstNet broadband down link signal. Similarly, an LMR 800 MHz down link signal may experience interference from an adjacent 861-869 MHz mobile broadband signal. Likewise, an LMR 900 MHz down link signal may experience interference from an LTE down link signal contained in the same 935-940 MHz band. The manner in which communication devices 104 and 106 mitigate the broadband interference to signals will become evident as the discussion progresses.

Figure 2:
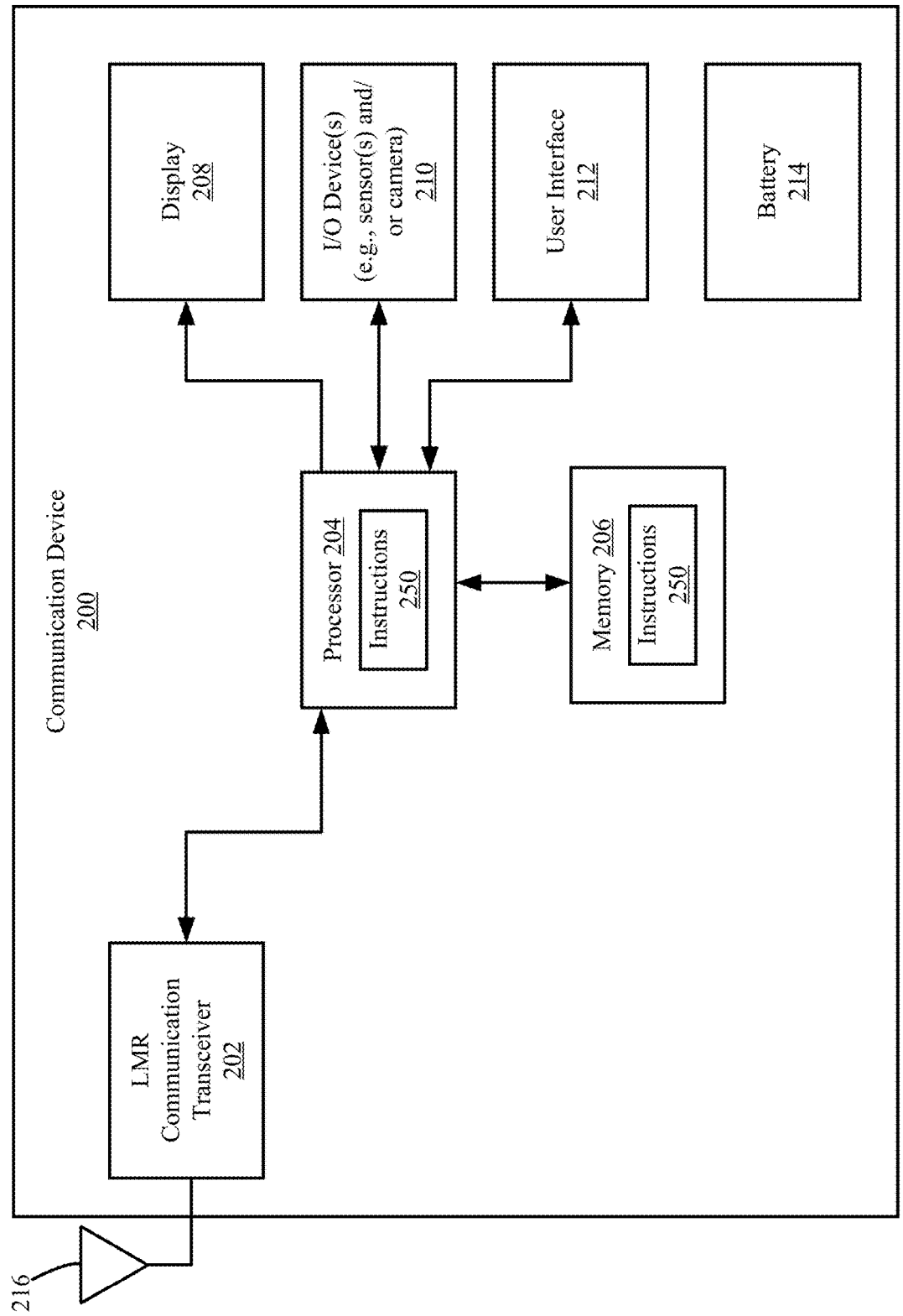
FIG. 2 is an illustration of an illustrative communication device architecture.

Referring now to FIG. 2, there is provided an illustration of an illustrative architecture for a communication device 200 which is configured for carrying out the various methods described herein for mitigating the broadband interference. Communication devices 102-106 are the same as or similar to communication device 200. As such, the discussion provided below in relation to communication device 200 is sufficient for understanding communication devices 102-106 of FIG. 1 Communication device 200 can include more or less components than that shown in FIG. 2 in accordance with a given application. For example, a communication device 200 can include one or both components 208 and 210. The present solution is not limited in this regard.

As shown in FIG. 2, the communication device 200 comprises an LMR communication transceiver 202 coupled to an antenna 216. The LMR communication transceiver can comprise one or more components such as a processor, an application specific circuit, a programmable logic device, a digital signal processor, or other circuit programmed to perform the functions described herein. The communication transceiver 202 can enable end-to-end LMR communication services in a manner known in the art. In this regard, the communication transceiver can facilitate communication of voice and data from the communication device 200 over an LMR network.

Although the communication device 200 has been described herein as comprising an LMR communication transceiver, it should be understood that the solution is not limited in this regard. In some scenarios, the communication network can comprise a cellular communication network instead of an LMR type network. In that case, the communication device 200 could include a cellular network communication transceiver in place of an LMR communication transceiver. In another scenario, the communication device 200 could include both an LMR communication transceiver and a cellular network communication transceiver. In this regard, it should be understood that the solutions described herein can be implemented in an LMR communication network, a cellular communication network, and/or any other communication network where interference by another communication system exists that generates energy that may result in interference on neighboring channels.

The LMR communication transceiver 202 is connected to a processor 204 comprising an electronic circuit. During operation, the processor 204 is configured to control the LMR communication transceiver 202 for providing LMR services. The processor 204 also facilitates mitigation of interference from undesired signals. The manner in which the processor facilitates interference mitigation will become evident as the discussion progresses.

A memory 206, display 208, user interface 212 and Input/Output ("I/O") device(s) 210 are also connected to the processor 204. The processor 204 may be configured to collect and store data generated by the I/O device(s) 210 and/or external devices (not shown). Data stored in memory 206 can include, but is not limited to, one or more look-up tables or databases which facilitate selection of communication groups or specific communication devices. The user interface 212 includes, but is not limited to, a plurality of user depressible buttons that may be used, for example, for entering numerical inputs and selecting various functions of the communication device 200. This portion of the user interface may be configured as a keypad. Additional control buttons and/or rotatable knobs may also be provided with the user interface 212. A battery 214 or other power source may be provided for powering the components of the communication device 200. The battery 200 may comprise a rechargeable and/or replaceable battery. Batteries are well known in the art, and therefore will not be discussed here.

The communication device architecture shown in FIG. 2 should be understood to be one possible example of a communication device system which can be used in connection with the various implementations disclosed herein. However, the systems and methods disclosed herein are not limited in this regard and any other suitable communication device system architecture can also be used without limitation. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the illustrative system is applicable to software, firmware, and hardware implementations.

Figure 3:
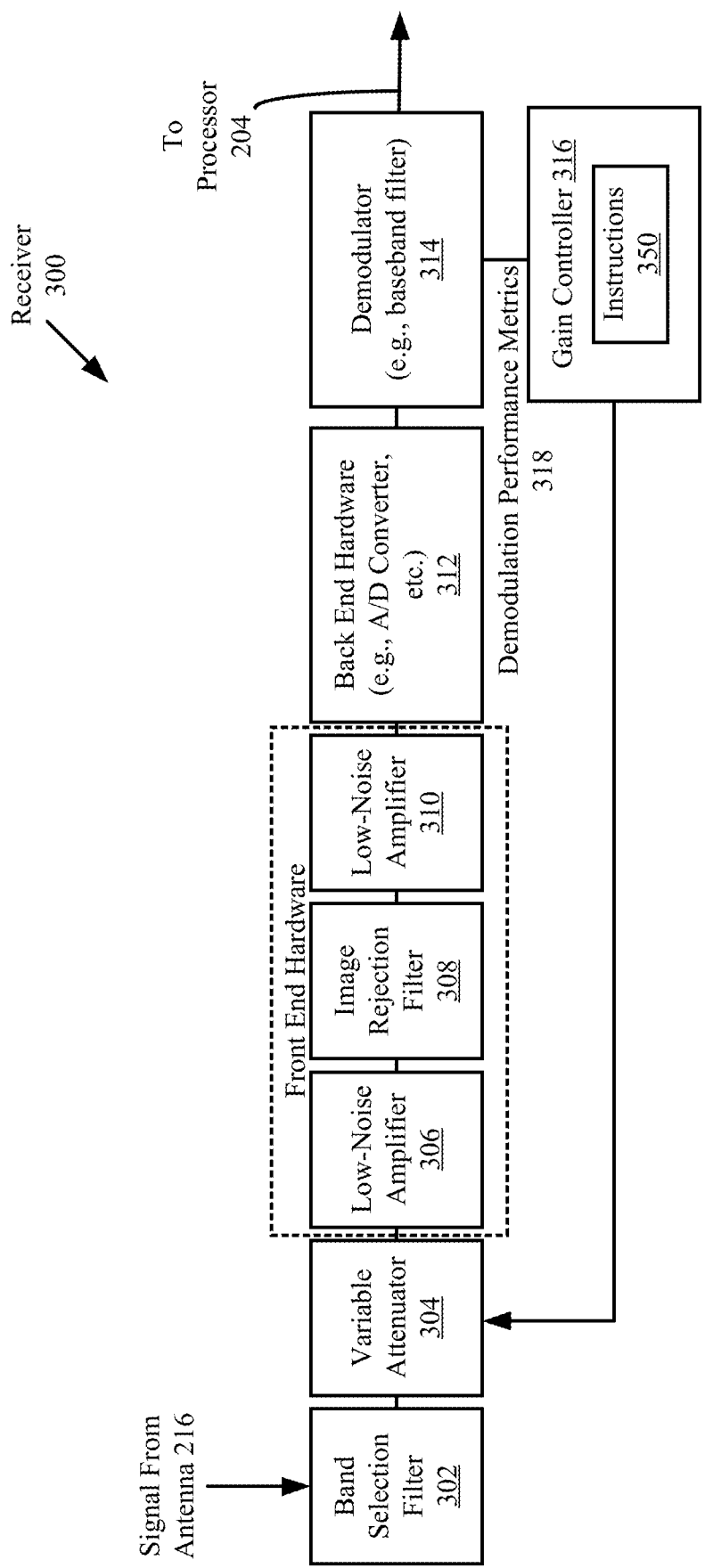
FIG. 3 is an illustration of an illustrative receiver architecture.

Referring now to FIG. 3, there is provided a more detailed illustration of an illustrative receiver portion 300 of the LMR communication transceiver 202. Receiver 300 comprises a band selection filter 302, a variable attenuator 304, front end hardware 306-310, back end hardware 312, a demodulator 314 (e.g., a baseband filter), and a gain controller 316. Each of the listed devices 302-314 is known in the art, and therefore will not be described herein. Still, it should be noted that the band selection filter 302 receives signals from the antenna 216 of FIG. 2, filters the received signals, and forwards the filtered signals to the variable attenuator 304. The variable attenuator 304 applies attenuation to optimize the ability of receiver 300 to demodulate signals with the best quality. The receiver gain profile amount of attenuation is controlled by the gain controller 316 based on demodulation performance metrics 318 generated by the demodulator 314. The demodulation performance metrics 318 can be continuously or periodically provided by the demodulator 314. In the periodic scenario, the demodulation performance metrics 318 may be provided when the front end gain is in a particular state and when the front end gain state has been changed to another particular state. The manner in which the gain profile by the variable attenuator 304 is controlled will become evident as the discussion progresses.

The gain controller 316 can include, but is not limited to, a circuit, or a processor executing instructions 350 implementing the methods described herein for mitigating broadband and/or IM interference. The gain controller 316 may be provided as part of a central processor (e.g., processor 204 of FIG. 2) for the communication device or is provided as a processor in addition to the central processor. The gain controller 316 can constitute machine-readable media. The term "machine-readable media", as used here, refers to a single medium or multiple media (e.g., computer devices) that store the one or more sets of instructions 350. The term "machine-readable media", as used here, also refers to any medium that is capable of storing, encoding or carrying a set of instructions 350 for execution by the gain controller 316 and that cause the gain controller 316 to perform any one or more of the methodologies of the present disclosure.

The present solution is not limited to the architecture shown in FIG. 3. For example, in other scenarios, the band selection filter 302 may reside after the variable attenuator 304, rather than before the variable attenuator 304 as shown in FIG. 3.

Figure 4:
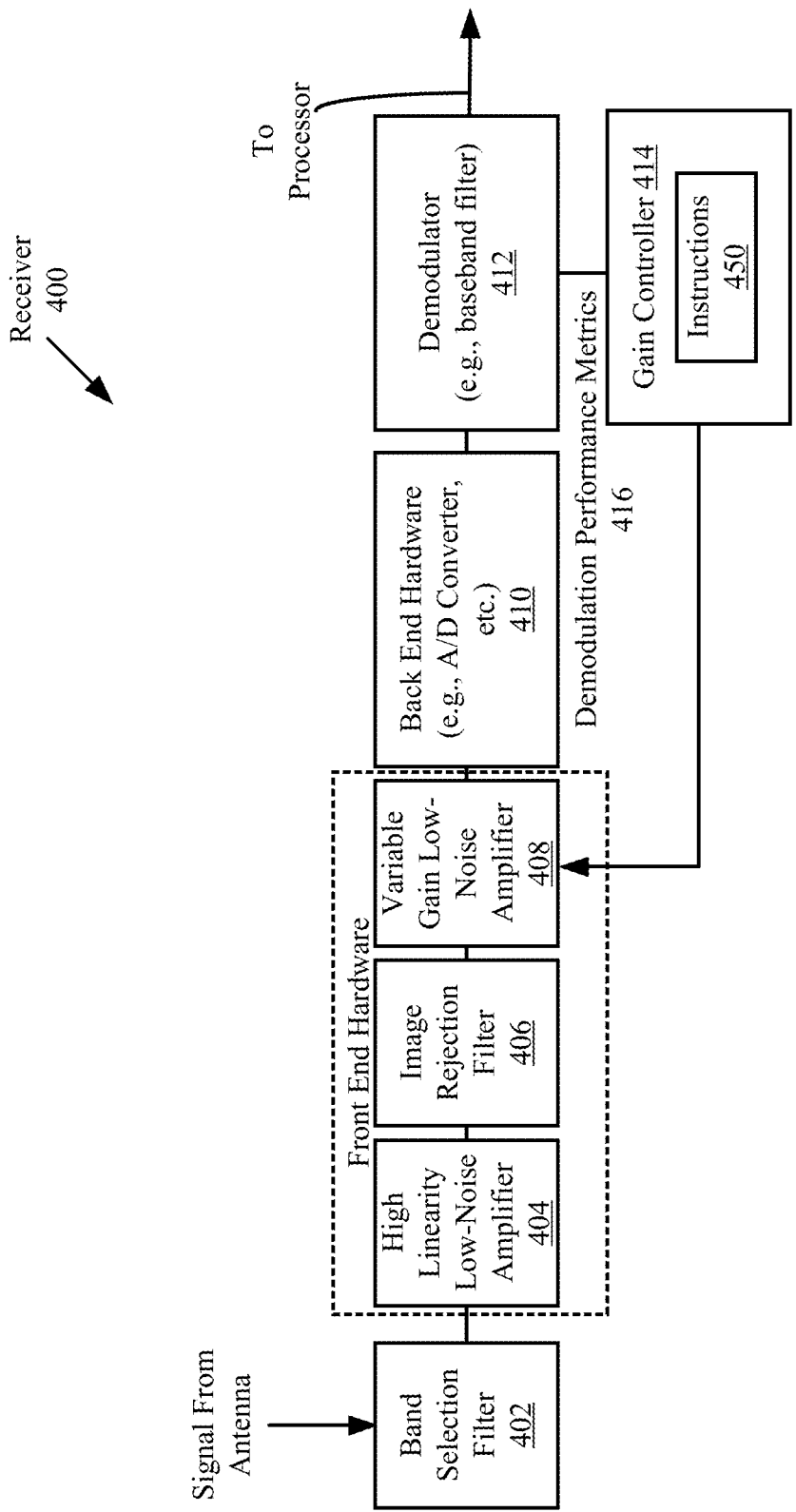
FIG. 4 is an illustration of another illustrative receiver architecture.

Another illustrative architecture for a receiver portion of an LMR communications transceiver that can implement the present solution is shown in FIG. 4. Referring now to FIG. 4, the receiver 400 comprises a band selection filter 402, front end hardware 404-408, back end hardware 410, a demodulator 412 (e.g., a baseband filter), and a gain controller 414. The front end hardware comprises a high linearity LNA 404, an image rejection filter 406, and a variable gain LNA 408. Each of the listed devices 402-412 is known in the art, and therefore will not be described herein. Still, it should be noted that the band selection filter 402 receives signals from the antenna, filters the received signals, and forwards the filtered signals to the front end hardware 404-408. At the front end hardware 404-408, the signal is further processed by LNA 404 and filter 406. Next, the signal is passed to the variable gain LNA 408. The variable gain LNA 408 applies attenuation to optimize the ability of the receiver 400 to demodulate signals with best quality. The amount of attenuation is controlled by the gain controller 414 based on demodulation performance metrics 416 generated by the demodulator 412. The demodulation performance metrics 416 can be continuously or periodically provided by the demodulator 412. In the periodic scenario, the demodulation performance metrics 416 may be provided when the front end gain is in a particular state and when the front end gain state has been changed to another particular state. The manner in which the attenuation by the variable gain LNA 408 is controlled will become evident as the discussion progresses.

The gain controller 414 can include, but is not limited to, a circuit, or a processor executing instructions 450 implementing the methods described herein for mitigating broadband and/or IM interference. The gain controller 414 may be provided as part of a central processor (e.g., processor 204 of FIG. 1) for the communication device or is provided as a processor in addition to the central processor. The gain controller 414 can constitute machine-readable media. The term "machine-readable media", as used here, refers to a single medium or multiple media (e.g., computer devices) that store the one or more sets of instructions 450. The term "machine-readable media", as used here, also refers to any medium that is capable of storing, encoding or carrying a set of instructions 450 for execution by the gain controller 414 and that cause the gain controller 414 to perform any one or more of the methodologies of the present disclosure.

The demodulation performance metrics 416 can include, but are not limited to, a BER, a BDR, an ASE, a synchronization error, and/or a modulation fidelity. The BER is the rate at which error occur in the transmission of digital data. The BDR is the percent of data blocks which are not decoded during given time window(s). The ASE is the degree of error between the actual waveform at the time of a bit decision and a reference waveform. The synchronization error is determined using the received waveform prior to demodulation or bit decisions. The synchronization error comprises the difference between an actual correlation of known content (for example synchronization bits) in the received waveform and a reference signal containing the known content and an optimal correlation of the reference signal with itself. The modulation fidelity refers to the quality of a received signal (i.e., how closely does a received waveform match a reference waveform which can be determined by comparing reference symbol values to received symbol values).

Figure 5:
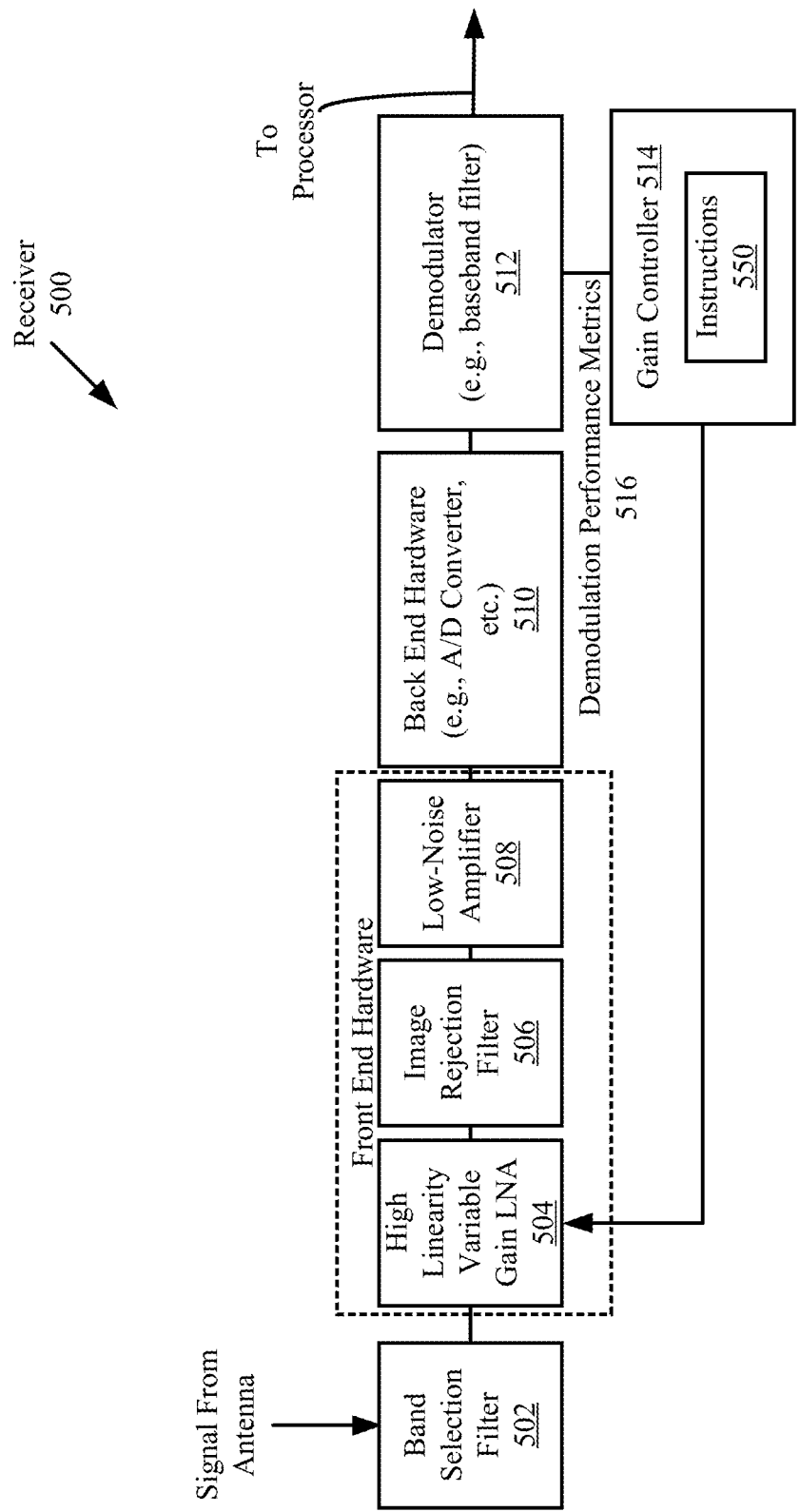
FIG. 5 is an illustration of another illustrative receiver architecture.

Another illustrative architecture for a receiver portion of an LMR communications transceiver that can implement the present solution is shown in FIG. 5. Referring now to FIG. 5, the receiver 500 comprises a band selection filter 502, front end hardware 504-508, back end hardware 510, a demodulator 512 (e.g., a baseband filter), and a gain controller 514. The front end hardware comprises a high linearity variable LNA 504, an image rejection filter 506, and an LNA 508. Each of the listed devices 502-512 is known in the art, and therefore will not be described herein. Still, it should be noted that the band selection filter 502 receives signals from the antenna, filters the received signals, and forwards the filtered signals to the front end hardware 504-508. At the front end hardware 504-508, the signal is further processed by variable gain LNA 504. More specifically, the high linearity variable gain LNA 504 applies an optimal gain to place the receiver 500 in the best gain profile to optimize receiver demodulation performance by trading off linearity against sensitivity. The amount of gain is controlled by the gain controller 514 based on demodulation performance metrics 516 generated by the demodulator 512. The demodulation performance metrics 516 can be continuously or periodically provided by the demodulator 512. In the periodic scenario, the demodulation performance metrics 516 may be provided when the front end gain is in a particular state and when the front end gain state has been changed to another particular state. The manner in which the attenuation by the high linearity variable gain LNA 504 is controlled will become evident as the discussion progresses.

The gain controller 514 can include, but is not limited to, a circuit, or a processor executing instructions 550 implementing the methods described herein for mitigating broadband and/or IM interference. The gain controller 514 may be provided as part of a central processor (e.g., processor 204 of FIG. 1) for the communication device or is provided as a processor in addition to the central processor. The gain controller 514 can constitute machine-readable media. The term "machine-readable media", as used here, refers to a single medium or multiple media (e.g., computer devices) that store the one or more sets of instructions 550. The term "machine-readable media", as used here, also refers to any medium that is capable of storing, encoding or carrying a set of instructions 550 for execution by the gain controller 514 and that cause the gain controller 514 to perform any one or more of the methodologies of the present disclosure.

Figure 6:
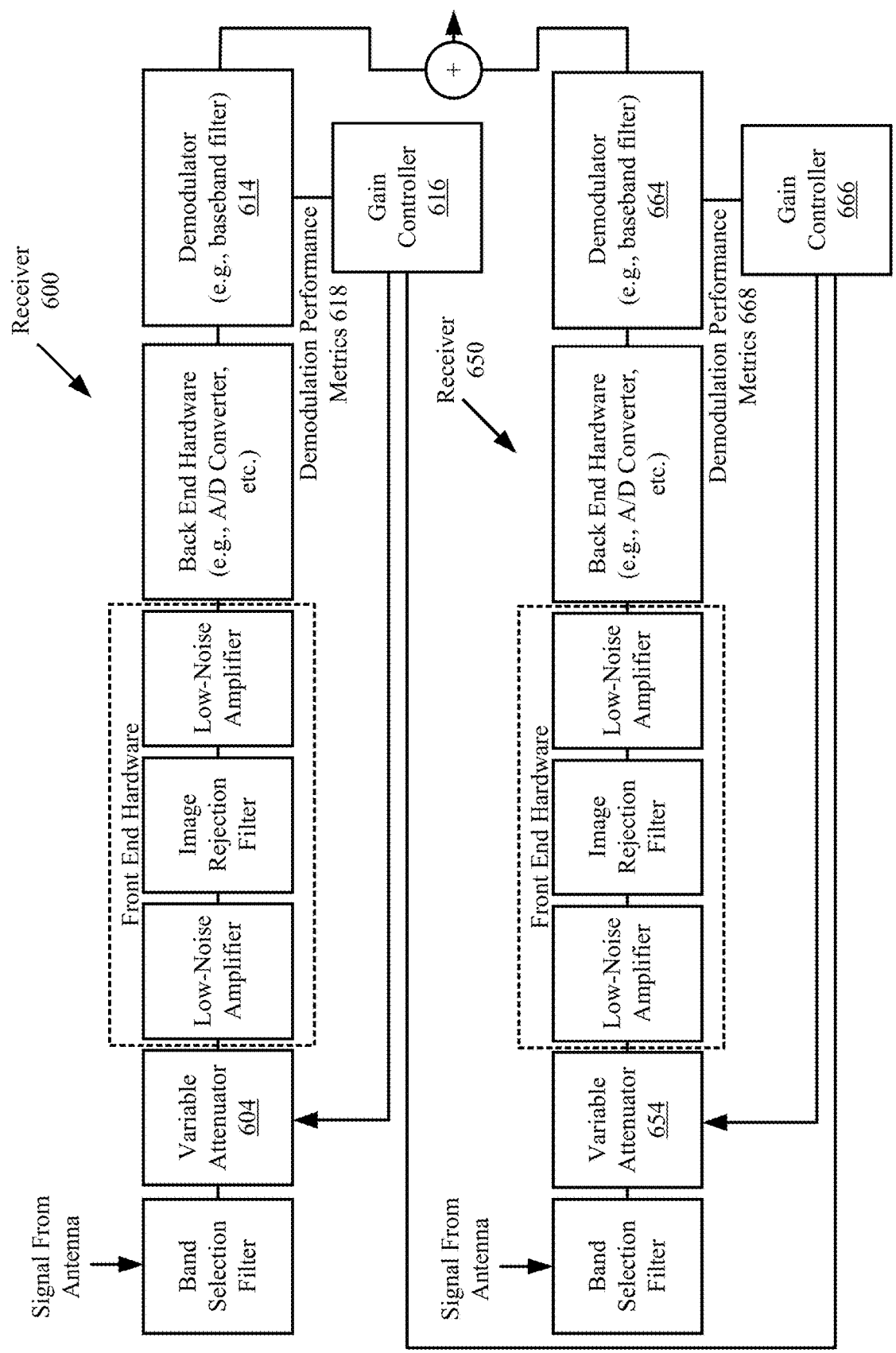
FIG. 6 is an illustration of another illustrative receiver architecture.

Another illustrative architecture for a receiver portion of an LMR communications transceiver that can implement the present solution is shown in FIG. 6. Referring now to FIG. 6, the LMR communications transceiver comprises two receivers 600, 650. Receiver 600 can be the same as or similar to receiver 300 of FIG. 3. However, receiver 650 is of the same or different type and/or quality as receiver 600. In some scenarios, receiver 650 is selected to be of a lower quality as compared to receiver 600 so that receiver 650 can be used to detect the occurrence of broadband and/or IM interference relatively early, as discussed in more detail below. In other scenarios, the LMR communications transceiver has any number of receivers selected in accordance with a given application, i.e., has N receivers where N is an integer equal to or greater than 1.

The gain controllers 616, 666 of receivers 600, 650 can include, but are not limited to, a circuit, or a processor executing instructions implementing the methods described herein for mitigating IM interference. The gain controllers 616, 666 may be provided as part of a central processor (e.g., processor 204 of FIG. 1) for the communication device or is provided as a processor in addition to the central processor. The output of the demodulator of the first receiver may be combined with an output of a demodulator of the second receiver to provide improved performance. Techniques for combining multiple receiver outputs are well known and may include selecting the better performance receiver, adding receiver outputs, maximum ratio combining, and other techniques. The present solution is not limited to the architecture shown in FIG. 6. For example, other scenarios, only one gain controller is provided instead of two gain controller as shown.

Figure 7:
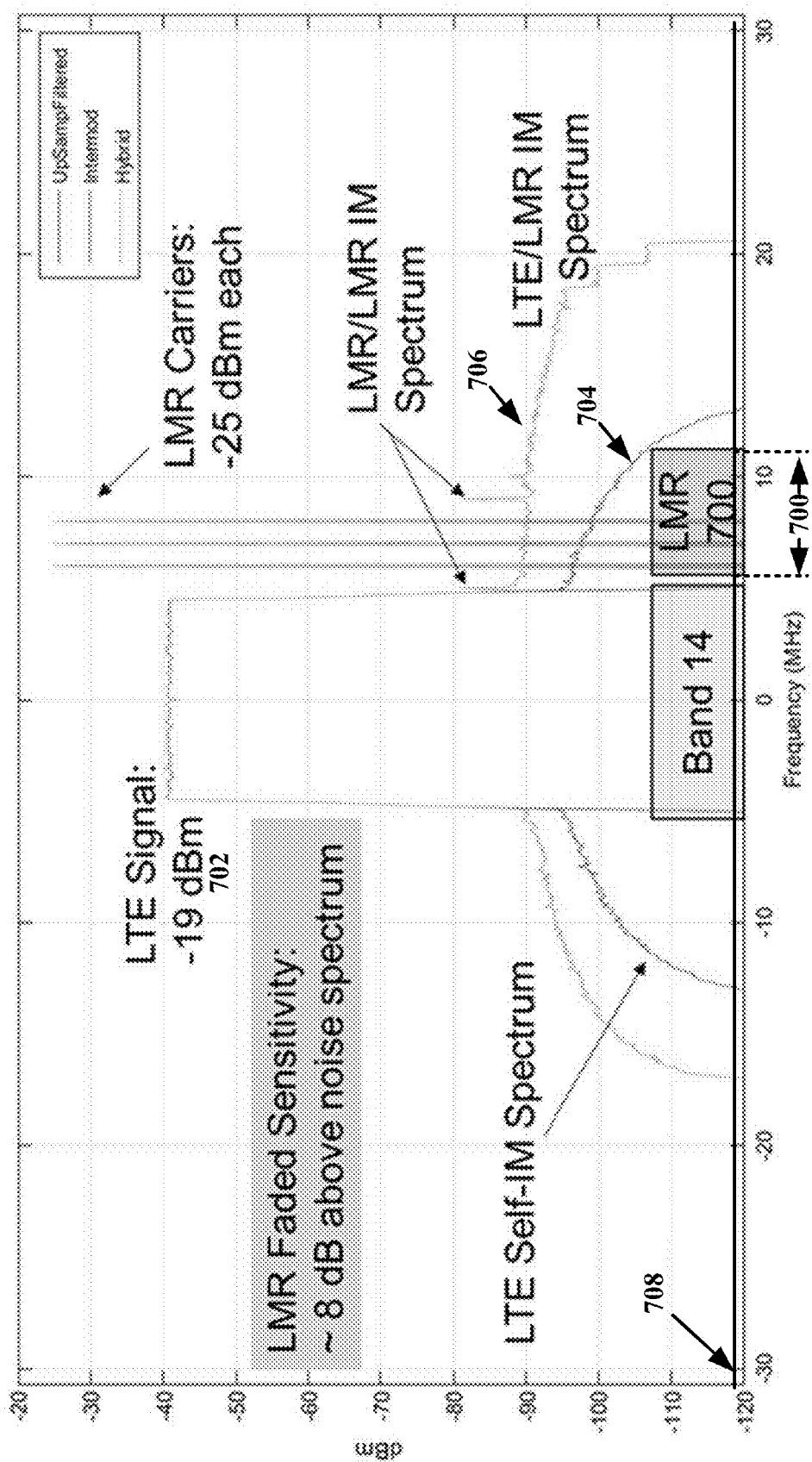
FIG. 7 is a graph that is useful for understanding LTE interference in an LMR band.

Referring now to FIG. 7, there is provided a simulation graph that is useful for understanding how the noise interference is caused by an LTE signal 702 in the LMR band 700. The LTE signal 702 is a standard 10 MHz configuration operating in a test mode designed by 3GPP (TM-3.1) for evaluating out of band energy. As shown, the power bandwidth if the signal is about 9 MHz wide with the spectrum energy that falls off outside of this power bandwidth. Spectrum 704 represents the relative power of the noise interference that is caused by a spreading of the LTE signal 702 into the LMR band 700 due to $3^{rd}$ order intermodulation. Higher order products would have even greater frequency spreading effects. This additional noise that shows up at the receiver's front end degrades the performance of the receiver. Spectrum 706 represents the noise interference when both LMR carriers and the LTE signal 702 are present at higher power to create intermodulation effects between LTE and LMR carriers in the LMR band 700. In this case, there is an even higher interference to signals in the receiver band. This intermodulation induced on channel noise exists because of linearity limitations of the receiver. If an interfering signal captured by the radio is higher power than the linear operating region of the receiver, lowering the gain of the receiver appropriately results in a much larger drop in interference from intermodulation. For example, if 1 dB of gain is removed in the receiver, before the linearity limiting components then the noise floor decreases by 3 dB if the interference is dominated by $3^{rd}$ order intermodulation products. Thus, an advantage is obtained by attenuating the desired signal because the interference generated by intermodulation is attenuated 2-5 times as much in decibels.

Figure 8:
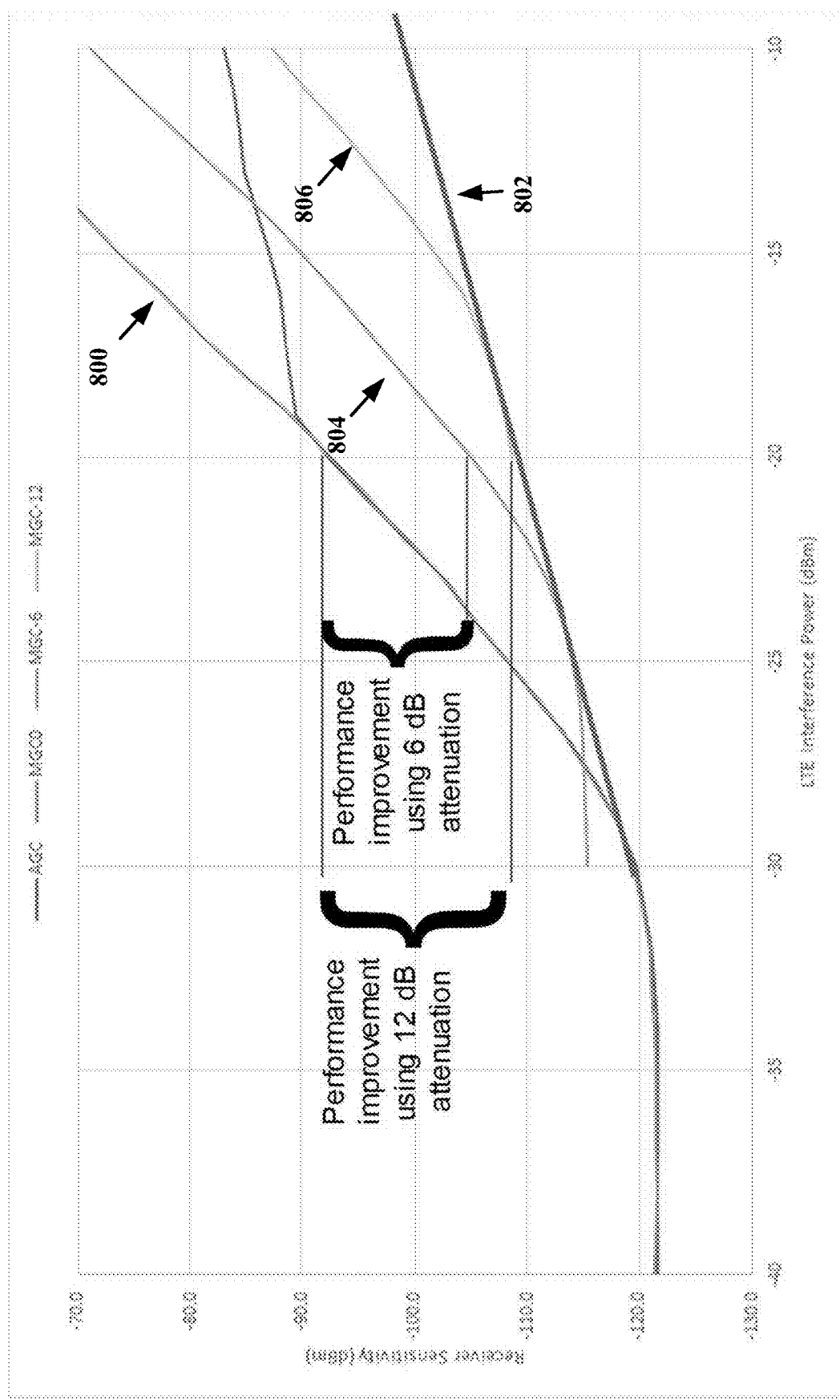
FIG. 8 is a graph that is useful for understanding the present solution.

Referring now to FIG. 8, there is provided a graph showing a typical performance of an LMR receiver when no gain reduction is applied prior to its front end hardware. The current performance is represented by line 800. Line 800 has a slope of 3:1, in this example meaning that for every 1 dB increase in LTE interference power the receiver sensitivity is diminished by 3 dB. The slope is defined as the change in interference noise power over the change in gain (i.e., A noise power/A gain). The 3:1 slope is due to the $3^{rd}$ order IM products caused by an LTE site's signal level placing the communication device receiver in a non-linear operating region. Line 802 represents an example improved performance of the LMR receiver when an optimal amount of gain adjustment is provided to its front end. Line 802 has a slope of 1:1, which indicates that the LMR receiver is operating in a linear operating region. Line 804 represents the LMR receiver performance when 6 dB of attenuation is applied to its front end. As can be seen, there is an improvement in LMR receiver performance when 6 dB of attenuation is applied to its front end that transitions from no improvement with an LTE power of −28 dBm to 18 dB improvement with an LTE power greater than −18 dBm. However, 6 dB of sensitivity is lost in the receiver when no interference is present. Line 806 represent the LMR receiver performance when 12 dB of attenuation is applied. As can be seen, there is an improvement in LMR receiver performance when 12 dB of attenuation is applied to its front end that transitions from no improvement with an LTE power of −22 dBm to 36 dB improvement with an LTE power greater than −12 dBm. However, 12 dB of sensitivity is lost in the receiver when no interference is present.

Notably, the attenuation should not be continuously applied at the receiver front end to mitigate the LTE interference because some sensitivity of the receiver would be lost during times when the IM condition does not exit. So, the present solution waits until the gain controller can estimate based on demodulation performance metrics that the communication device is under the influence of IM interference or is predicted to soon be under the influence of IM interference. The process can be implemented by a continuous adaptive loop or discrete hypothesis testing of demodulation performance metrics.

Notably, the Telecommunications Industry Association ("TIA") has defined test and performance requirements for LMR radios in the presence of LTE signals in the 700, 800 and 900 MHz bands. These performance requirements include a minimum standard for IM rejection and LTE interference from −40 dBm to −10 dBm. These performance requirements are currently in the approval process. The present solution provides ways of meeting these TIA's test and performance requirements for LMR radios.

Figure 9:
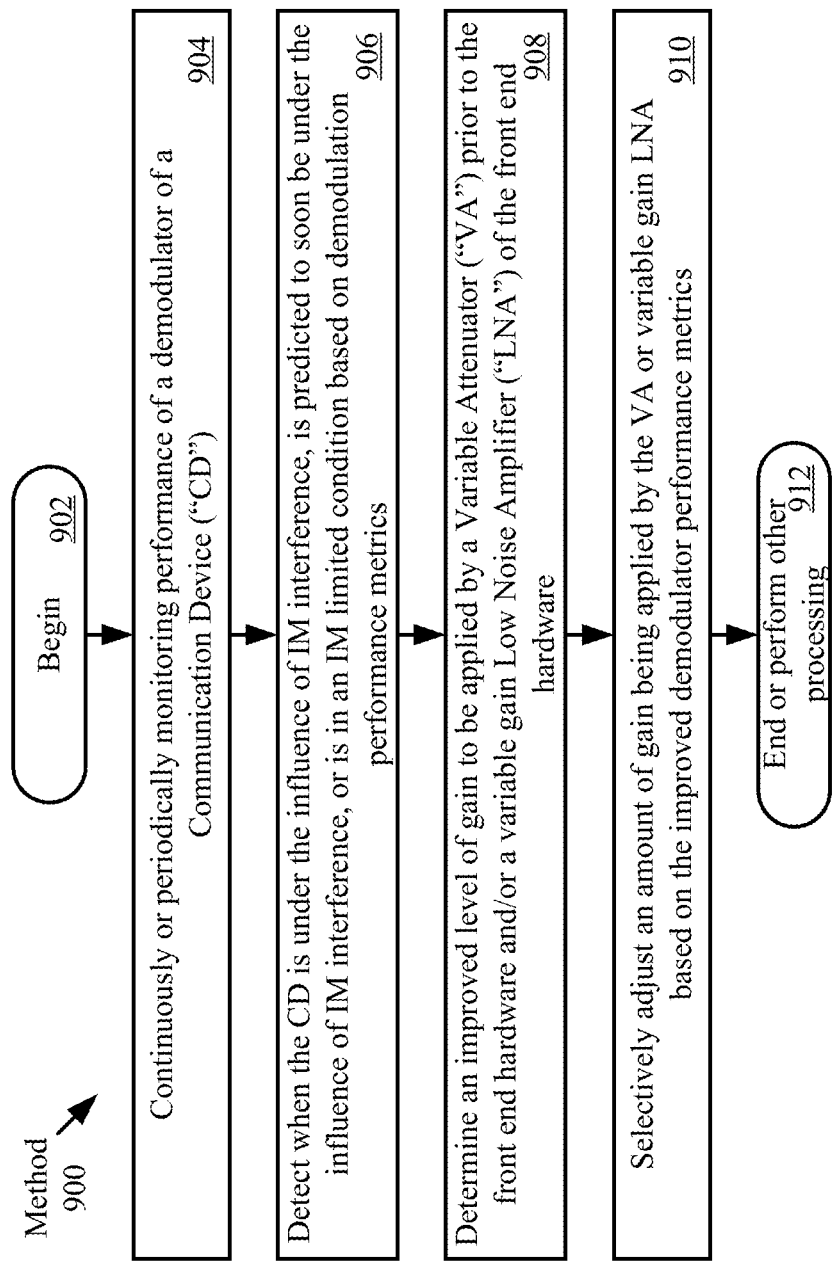
FIG. 9 is a flow diagram of a method for mitigating IM interference.

Referring now to FIG. 9, there is provided a method 900 for mitigating broadband and/or IM interference. Method 900 begins with 902 and continues with 904 where a communication device (e.g., communication device 104 or 106 of FIG. 1) performs operations to continuously or periodically monitor the performance of a demodulator (e.g., demodulator 314 of FIG. 3, 412 of FIG. 3, 512 of FIG. 3, 614 of FIG. 6, and/or 664 of FIG. 6) of the communication device. This monitoring can involve: generating demodulation performance metrics (e.g., demodulation performance metrics 318 of FIG. 3, 416 of FIG. 4, 516 of FIG. 5, 618 of FIG. 6, and/or 668 of FIG. 6) by the demodulator; and providing the demodulation performance metrics to a gain controller (e.g., gain controller 316 of FIG. 3, 414 of FIG. 4, 514 of FIG. 5, 616 of FIG. 6, and/or 666 of FIG. 6) of the communication device. The demodulation performance metrics can include, but are not limited to, a BER, a BDR, an ASE, a synchronization error, and/or a modulation fidelity. The demodulation performance metrics can be stored in the communication device's memory (e.g., memory 206 of FIG. 2), which is accessible to the gain controller.

In 906, the demodulation performance metrics of the communication device's demodulator(s) are used to detect when the communication device is under the influence of broadband and/or IM interference, is predicted to soon be under the influence of IM, or is in an IM limited condition. The manner in which the demodulation performance metrics are used here will become more evident as the discussion progresses. If the communication device is under the influence of broadband and/or IM interference, is predicted to soon be under the influence of IM interference or is in an IM limited condition, then an improved level of gain that is to be applied by a variable attenuator (e.g., variable attenuator 302 of FIG. 3, 604 of FIG. 6 and/or 654 of FIG. 6) prior to the front end hardware and/or a variable LNA (e.g., LNA 408 of FIG. 4 or 504 of FIG. 5) of the front end hardware is determined as shown by 908. In 910, the amount of gain being applied by the variable attenuator and/or LNA is selectively adjusted based on improved demodulator performance metrics. For example, the level of gain being applied by the variable attenuator and/or LNA is set equal to the improved level of gain (which may be a predefined value, a dynamically computed value based on current operating conditions, or a previous gain setting value for the receiver). Subsequently, 912 is performed where method 900 ends or other processing is performed (e.g., return to 902).

Figure 10:
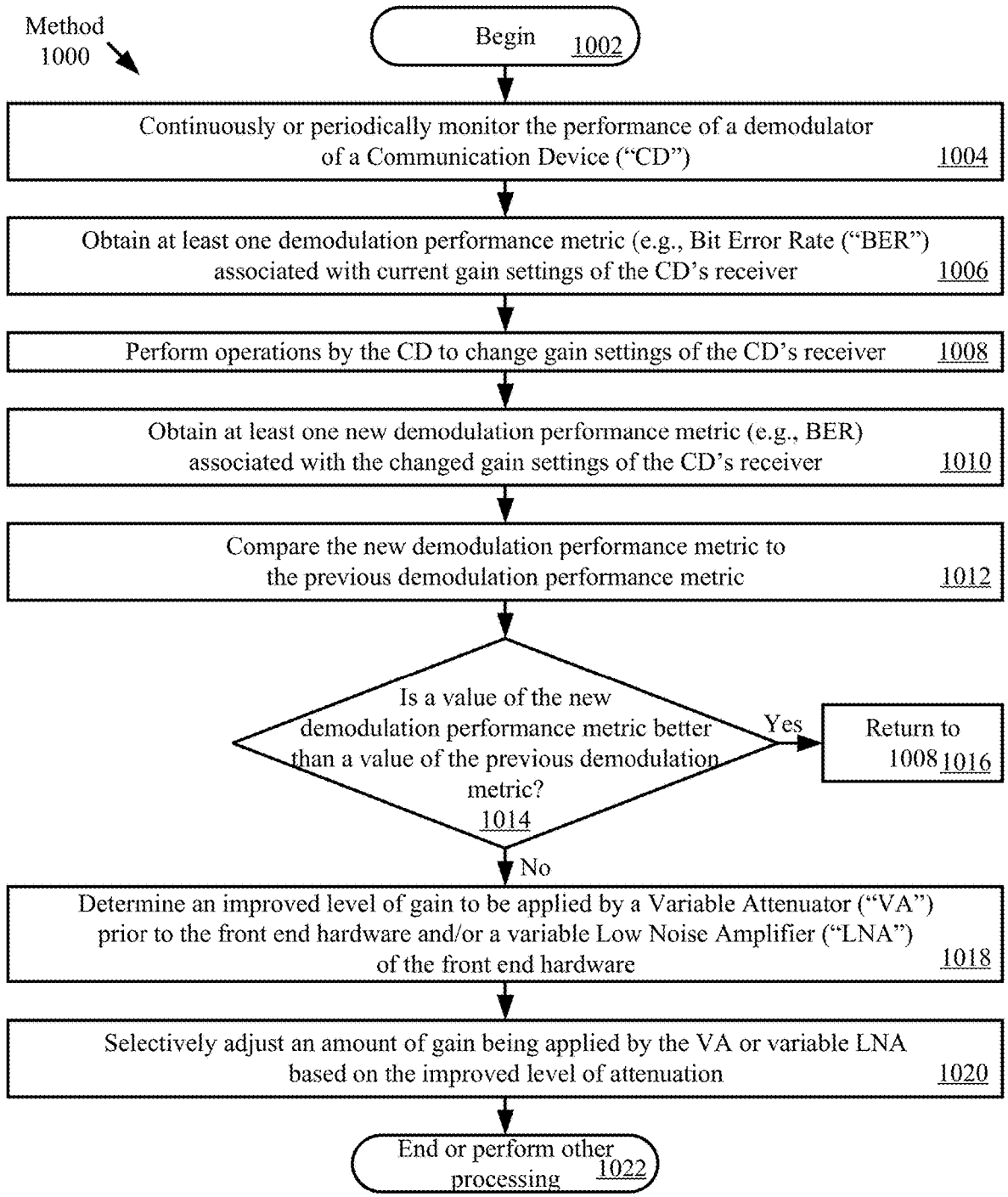
FIG. 10 is a flow diagram of a method for mitigating IM interference.

Referring now to FIG. 10, there is provided an illustrative method 1000 for mitigating broadband and/or IM interference. Method 1000 begins with 1002 and continues with 1004 where a communication device (e.g., communication device 104 or 106 of FIG. 1) performs operations to continuously or periodically monitor the performance of a demodulator (e.g., demodulator 314 of FIG. 3, 412 of FIG. 3, 512 of FIG. 3, 614 of FIG. 6, and/or 664 of FIG. 6) of the communication device. This monitoring can involve: generating demodulation performance metrics (e.g., demodulation performance metrics 318 of FIG. 3, 416 of FIG. 4, 516 of FIG. 5, 618 of FIG. 6, and/or 668 of FIG. 6) by the demodulator; and providing the demodulation performance metrics to a gain controller (e.g., gain controller 316 of FIG. 3, 414 of FIG. 4, 514 of FIG. 5, 616 of FIG. 6, and/or 666 of FIG. 6) of the communication device. The demodulation performance metrics can include, but are not limited to, a BER, a BDR, an ASE, a synchronization error, and/or a modulation fidelity. The demodulation performance metrics can be stored in the communication device's memory (e.g., memory 206 of FIG. 2), which is accessible to the gain controller.

Next in 1006, the communication device obtains at least one demodulation performance metric (e.g., the BER) that is associated with the current gain settings of the communication device's receiver (e.g., receiver 300 of FIG. 3, 400 of FIG. 4, 500 of FIG. 5, 600 of FIG. 6 or 650 of FIG. 6). Operations are then performed in 1008 by the communication device to change the gain setting(s) of the receiver. Gain settings are well known in the art, and therefore will not be described herein. Similarly, techniques for changing gain settings for receivers are well known in the art, and therefore will not be described herein. Once the gain settings have been changed, at least one new demodulation performance metric (e.g., BER) is obtained, as shown by 1010.

In 1012, the new demodulation performance metric is compared to the previous demodulation performance metric (e.g., the demodulation performance metric obtained in 1006). If the value of the new demodulation performance metric is better than (e.g., lower than) a value of the previous demodulation performance metric [1014:YES], then method 1000 returns to 1008. In contrast, if the value of the new demodulation performance metric is worse than (e.g., greater than) a value of the previous demodulation performance metric [1014:NO], then method 1000 continues with 1018. In 1018, an improved level of gain to be applied by a variable attenuator (e.g., variable attenuator 302 of FIG. 3, 604 of FIG. 6 and/or 654 of FIG. 6) prior to the front end hardware and/or a variable LNA (e.g., LNA 408 of FIG. 4 or 504 of FIG. 5) of the front end hardware is determined. For example, the improved level of gain is determined to be the level of gain that is associated with the previous demodulation performance metric or another previous demodulation performance metric which is associated with the best value of a plurality of previous demodulation performance metrics stored in the communication device's memory (e.g., memory 206 of FIG. 2). Next in 1020, the amount of gain being applied to the variable attenuator and/or variable LNA is selectively adjusted based on changing the gain in a direction toward improved performance metric results determined in 1018. Subsequently, 1022 is performed where method 1000 ends or other processing is performed.

Figure 11:
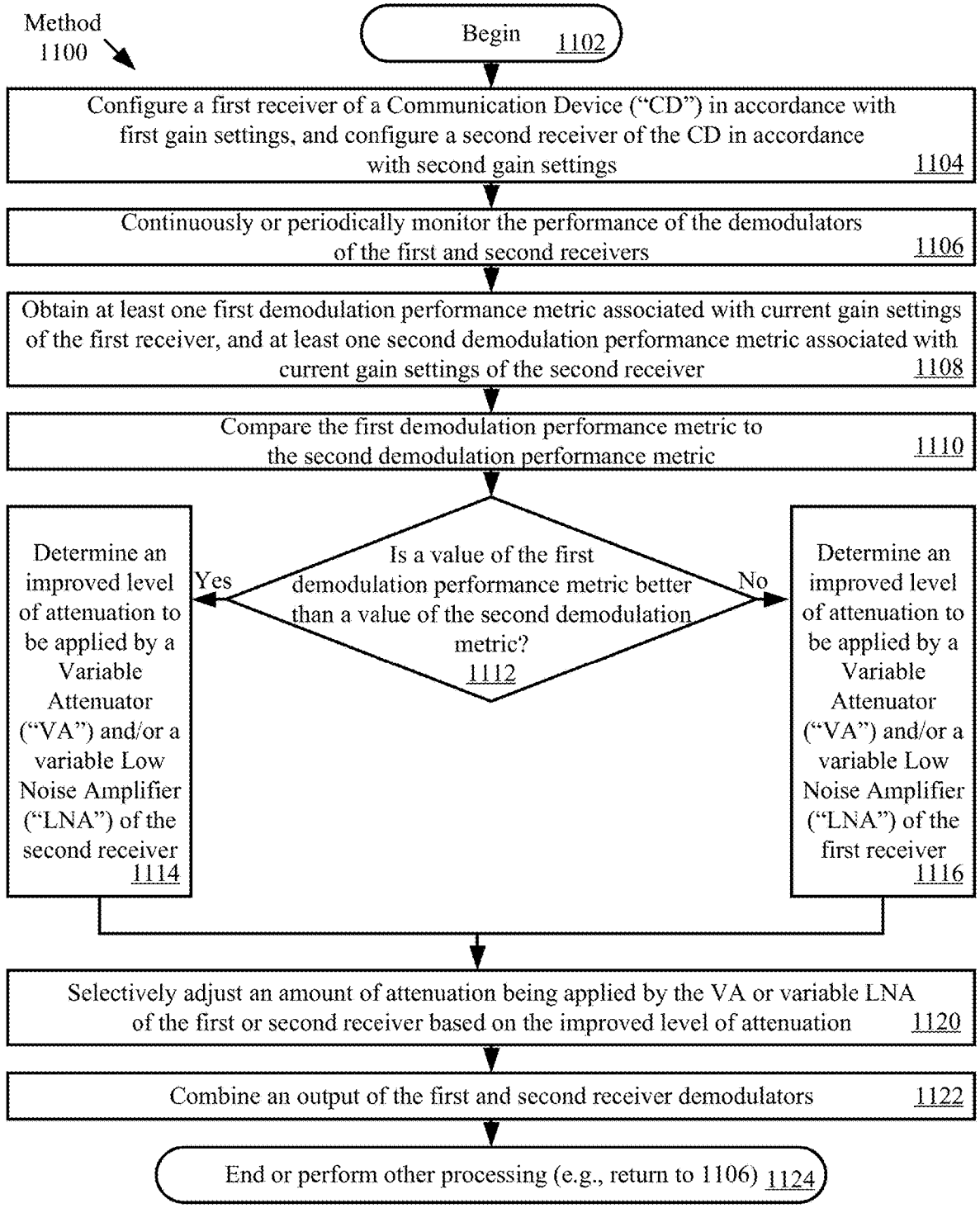
FIG. 11 is a flow diagram of a method for mitigating IM interference.

Referring now to FIG. 11, there is provided an illustrative method 1100 for mitigating broadband and/or IM interference. Method 1100 begins with 1102 and continues with 1104 where a first receiver (e.g., receiver 600 of FIG. 6) of a communication device (e.g., communication device 104 or 106 of FIG. 1) is configured in accordance with first gain settings and a second receiver (e.g., receiver 650 of FIG. 6) of the communication device is configured in accordance with second gain settings. Gain settings are well known in the art, and therefore will not be described herein. Also, techniques for configuring attenuators and/or LNAs in accordance with gain settings are well known in the art, and therefore will not be described herein.

Next in 1106, gain controllers (e.g., gain controllers 616 and 666 of FIG. 6) perform operations to continuously or periodically monitor the performance of the demodulators of the first and second receivers. This monitoring can involve: generating demodulation performance metrics (e.g., demodulation performance metrics 618 and 668 of FIG. 6) by the demodulators (e.g., demodulators 614 and 664 of FIG. 6) of the first and second receivers; and providing the demodulation performance metrics to gain controllers (e.g., gain controller 616 and 666 of FIG. 6) of the communication device. The demodulation performance metrics can include, but are not limited to, a BER, a BDR, an ASE, a synchronization error, and/or a modulation fidelity. The demodulation performance metrics can be stored in the communication device's memory (e.g., memory 206 of FIG. 2), which is accessible to the gain controllers.

In 1108, the gain controllers obtain at least one first demodulation performance metric associated with the current gain settings of the first receiver and at least one second demodulation performance metric associated with the current gain settings of the second receiver. The first demodulation performance metric is compared to the second demodulation performance metric in 1110. If a value of the first demodulation performance metric is better than (e.g., lower than) a value of the second demodulation performance metric [1112:YES], then method 1100 continues with 1114. In 1114, an improved level of attenuation for the second receiver is determined. In contrast, if the value of the first demodulation performance metric is worse than (e.g., greater than) the value of the second demodulation performance metric [1112:NO], then method 1100 continues with 1116. In 1116, an improved level of gain for the first receiver is determined. Thereafter, 1120 is performed where an amount of gain by a variable attenuator (e.g., variable attenuator 604 or 654 of FIG. 6) and/or a variable LNA of the first or second receiver is selectively adjusted based on adjusting the gain for predicted improved performance. The outputs of the first and second receiver demodulators may then combined as shown by 1122 according to several techniques well known in the art. Subsequently, 1124 is performed where method 1100 ends or other processing is performed.

Figure 12:
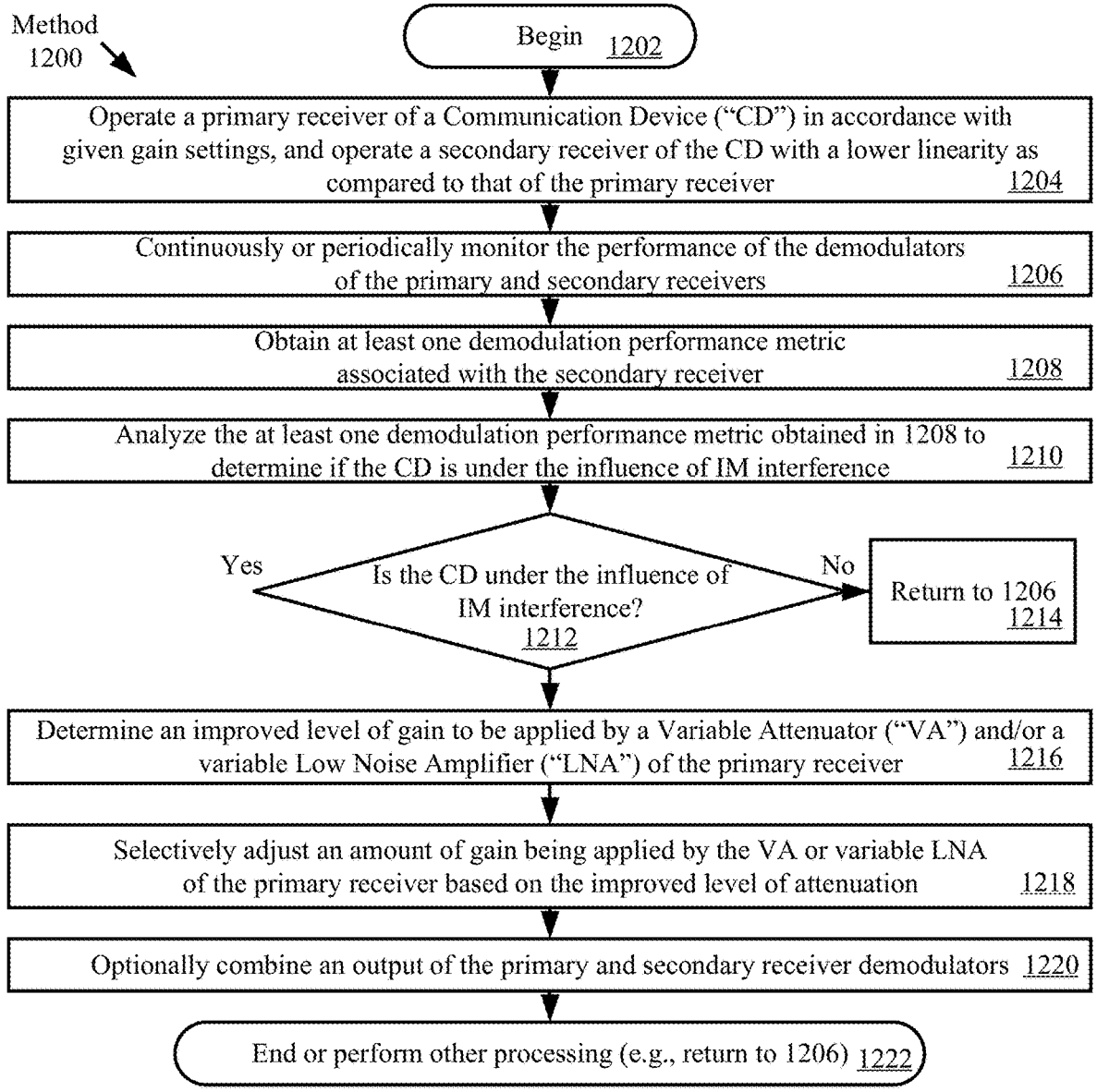
FIG. 12 is a flow diagram of a method for mitigating IM interference.

Referring now to FIG. 12, there is provided an illustrative method 1200 for mitigating broadband and/or IM interference. Method 1200 begins with 1202 and continues with 1204 where a primary receiver (e.g., receiver 600 of FIG. 6) of a communication device (e.g., communication device 104 or 106 of FIG. 1) is operated in accordance with a given gain setting. A secondary receiver (e.g., receiver 650 of FIG. 6) of the communication device is also operated in 1204. The secondary receiver has a lower linearity as compared with the linearity of the primary receiver. In 1206, gain controllers (e.g., gain controllers 616, 666 of FIG. 6) of the receivers continuously or periodically monitor the performance of their demodulators (e.g., demodulators 614, 664 of FIG. 6), respectively. This monitoring can involve: generating demodulation performance metrics (e.g., demodulation performance metrics 618 and 668 of FIG. 6) by the demodulators (e.g., demodulators 614 and 664 of FIG. 6) of the primary and secondary receivers; and providing the demodulation performance metrics to gain controllers (e.g., gain controller 616 and 666 of FIG. 6) of the communication device. The demodulation performance metrics can include, but are not limited to, a BER, a BDR, an ASE, a synchronization error, and/or a modulation fidelity. The demodulation performance metrics can be stored in the communication device's memory (e.g., memory 206 of FIG. 2), which is accessible to the gain controllers.

In 1208, a processor (e.g., processor 204 of FIG. 2) of the communication device obtains at least one demodulation performance metric associated with the secondary receiver. The demodulation performance metric is analyzed in 1210 to determine if the communication device is under the influence of IM interference. Notably, IM interference is more easily detected by analyzing the performance of the secondary receiver as opposed to the performance of the primary receiver. Accordingly, the secondary receiver's performance is used here to trigger gain adjustments in relation to the primary receiver.

If the communication device is not under the influence of IM interference [1212:NO], then method 1200 returns to 1206, as shown by 1214. In contrast, if the communication device is under the influence of IM interference [1212:YES], then method 1200 continues with 1216. In 1216, an improved level of gain to be applied by a variable attenuator (e.g., variable attenuator 604 or 654 of FIG. 6) and/or a variable LNA of the primary receiver is determined. The improved level of gain can be determined based on (1) results from comparing at least one current demodulation performance metric of the primary receiver to at least one previous demodulation performance metric of the primary receiver, or (2) pre-specified gain settings for respective levels of IM interference experienced by or likely to be experienced by the communication device. Techniques for determining actual or likely levels of IM interference are well known in the art, and therefore will not be described herein. Any known or to be known technique for determining actual or likely levels of IM interference can be used herein without limitation.

In 1218, an amount of gain being applied by the variable attenuator and/or LNA of the primary receiver is selectively adjusted in accordance with the improved level of gain. The outputs of the primary and secondary receivers' demodulators can be optionally combined as shown by 1220. Methods for combining demodulator outputs are well known in the art, and therefore will not be described herein. Any known or to be known method for combining demodulator outputs can be used herein without limitation. Subsequently, 1222 is performed where method 1200 ends or other processing is performed.

In some scenarios, the present solution employs one receiver that changes its linearity dynamically, measures a demodulation metric at different linearity conditions, and then determines how to optimize its gain settings. This is very similar to the methods of FIG. 12, but with one physical receiver.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for mitigating Intermodulation ("IM") interference, comprising:
    monitoring performance of at least one demodulator of a communication device;
    detecting when the communication device is under or will be under an influence of IM interference based on a performance of the at least one demodulator;
    determining an improved level of gain to be applied to (i) a variable attenuator of the communication device or (ii) a variable gain low noise amplifier of the communication device; and
    selectively adjusting an amount of gain being applied by the variable attenuator or variable gain low noise amplifier based on the improved level of attenuation;
    operating a first receiver in accordance with a first gain setting; and
    operating a second receiver in accordance with a second gain setting different from the first gain setting.

2. The method according to claim 1, wherein the performance of the at least one demodulator is defined by at least one of the following demodulation performance metrics: a Bit Error Rate ("BER"), a Block Drop Rate ("BDR"), an Average Symbol Error ("ASE"), a synchronization error, and a modulation fidelity.

3. The method according to claim 1, wherein the detecting comprises:
    obtaining at least one first demodulation performance metric associated with the first gain setting of the first receiver, and at least one second demodulation performance metric associated with the second gain setting of the second receiver; and
    comparing the at least one first demodulation performance metric of the first receiver to the at least one second demodulation performance metric of the second receiver.

4. The method according to claim 3, wherein the improved level of gain is determined for the first receiver when a value of the at least one first demodulation performance metric is worse than a value of the at least one second demodulation performance metric, and the improved level of gain is determined for the second receiver instead of the first receiver when the value of the at least one first demodulation performance metric is better than the value of the at least one second demodulation performance metric.

5. The method according to claim 4, further comprising combining an output of a demodulator of the first receiver with an output of a demodulator of the second receiver.

6. A method for mitigating Intermodulation ("IM") interference, comprising:
    monitoring performance of at least one demodulator of a communication device;
    detecting when the communication device is under or will be under an influence of IM interference based on a performance of the at least one demodulator;
    determining an improved level of gain to be applied to (i) a variable attenuator of the communication device or (ii) a variable gain low noise amplifier of the communication device;
    selectively adjusting an amount of gain being applied by the variable attenuator or variable gain low noise amplifier based on the improved level of attenuation;
    operating a primary receiver in accordance with a given gain setting; and
    operating a secondary receiver with a lower linearity as compared to a linearity of the primary receiver.

7. A method for mitigating Intermodulation ("IM") interference, comprising:
    monitoring performance of at least one demodulator of a communication device;
    detecting when the communication device is under or will be under an influence of IM interference based on a performance of the at least one demodulator;
    determining an improved level of gain to be applied to (i) a variable attenuator of the communication device or (ii) a variable gain low noise amplifier of the communication device;
    selectively adjusting an amount of gain being applied by the variable attenuator or variable gain low noise amplifier based on the improved level of attenuation
    operating a primary receiver in accordance with a given gain setting; and
    subsequently lowering the linearity of the primary receiver to obtain an apparent secondary receiver.

8. The method according to claim 7, wherein the detecting comprises:
    obtaining at least one demodulation performance metric for the secondary receiver;
    analyzing the at least one demodulation performance metric to determine whether the communication device is under or will be under an influence of IM interference.

9. The method according to claim 7, wherein a determination of the improved level of gain for the primary receiver is triggered when an analysis the at least one demodulation performance metric indicates that the communication device is under or will be under an influence of IM interference.

10. A communication device, comprising:
    a first receiver comprising a demodulator; and
    a control circuit configured to:
        monitor performance of the demodulator;
        detect when the communication device is under or will be under an influence of IM interference based on a performance of the demodulator;
        determine an improved level of gain to be applied to a variable gain device; and
        selectively adjust an amount of gain being applied by the variable gain device based on the improved level of attenuation;
        cause the first receiver to operate in accordance with a first gain setting; and
        cause a second receiver to operate in accordance with a second gain setting different from the first gain setting.

11. The communication device according to claim 10, wherein the performance of the demodulator is defined by at least one of the following demodulation performance metrics: a Bit Error Rate ("BER"), a Block Drop Rate ("BDR"), an Average Symbol Error ("ASE"), a synchronization error, and a modulation fidelity.

12. The communication device according to claim 10, wherein a detection as to when the communication device is under or will be under an influence of IM interference is made by:
    obtaining at least one first demodulation performance metric associated with the first gain setting of the first receiver, and at least one second demodulation performance metric associated with the second gain setting of the second receiver; and comparing the at least one first demodulation performance metric of the first receiver to the at least one second demodulation performance metric of the second receiver.

13. The communication device according to claim 12, wherein the improved level of gain is determined for the first receiver when a value of the at least one first demodulation performance metric is worse than a value of the at least one second demodulation performance metric, and the improved level of gain is determined for the second receiver instead of the first receiver when the value of the at least one first demodulation performance metric is better than the value of the at least one second demodulation performance metric.

14. The communication device according to claim 12, wherein an output of a demodulator of the first receiver is combined with an output of a demodulator of the second receiver.

15. A communication device, comprising:
a first receiver comprising a demodulator; and
a control circuit configured to:
monitor performance of the demodulator;
detect when the communication device is under or will be under an influence of IM interference based on a performance of the demodulator;
determine an improved level of gain to be applied to a variable gain device; and
selectively adjust an amount of gain being applied by the variable gain device based on the improved level of attenuation;
wherein the control circuit is further configured to:
cause a primary receiver to operate in accordance with a given gain setting; and
cause a secondary receiver to operate which has a lower linearity as compared to a linearity of the primary receiver.

16. The communication device according to claim 15, wherein a detection as to when the communication device is under or will be under an influence of IM interference is made by:
obtaining at least one demodulation performance metric for the secondary receiver;
analyzing the at least one demodulation performance metric to determine whether the communication device is under or will be under an influence of 1M interference.

17. The communication device according to claim 15, wherein a determination of the improved level of gain for the primary receiver is triggered when an analysis the at least one demodulation performance metric indicates that the communication device is under or will be under an influence of IM interference.

* * * * *